United States Patent [19]

Lee

[11] Patent Number: 5,786,111
[45] Date of Patent: Jul. 28, 1998

[54] PHASE SHIFT MASK AND FABRICATING METHOD THEREOF

[75] Inventor: Jun-Seok Lee, Seoul, Rep. of Korea

[73] Assignee: LG Semicon Co., Ltd., Choongcheongbuk-Do, Rep. of Korea

[21] Appl. No.: 647,739

[22] Filed: May 15, 1996

[30] Foreign Application Priority Data

May 19, 1995 [KR] Rep. of Korea .................. 1995/12565

[51] Int. Cl.⁶ ...................................................... G03F 9/00
[52] U.S. Cl. ........................................................... 430/5
[58] Field of Search .............................. 430/5, 311, 312, 430/313, 314

[56] References Cited

U.S. PATENT DOCUMENTS 5,300,377  4/1994  Keum ..................................... 430/5
5,487,962  1/1996  Rolfson .................................. 430/5

*Primary Examiner*—S. Rosasco
*Attorney, Agent, or Firm*—Morgan, Lewis & Bockius LLP

[57] ABSTRACT

A phase shift mask comprising a light transmitting substrate, a light shift layer formed on the light transmitting substrate, the light phase shift layer including a light transmitting region of a first thickness and a phase transition region of a second thickness and a slanted region of a non-uniform thickness extending from the phase transition region; and a light shielding layer covering the slanted region.

29 Claims, 12 Drawing Sheets

PHASE SHIFT MASK AND FABRICATING METHOD THEREOF

BACKGROUND OF THE INVENTION

1. Field of the Invention

The present invention relates to a phase shift mask and a fabricating method thereof.

2. Description of the Related Art

As the needs for thin and compact-sized semiconductor devices increase, semiconductor device having larger capacities have been widely studied. To improve the photolithographic resolution of such devices, various photolithography processes have been extensively studied, including those involving mask process. Among these mask processes, phase shift mask fabricating technology, which is capable of patterning a device using a phase transition effect to achieve a high resolution ability, has been closely studied. Among the phase shift masks used in phase shift mask fabrication, the alternating type, the rim type, and the attenuating type are well known in the industry. This is in contrast to other types of phase shift masks that use a pattern of a light shielding layer formed on the light transmitting substrate.

The phase shift mask is directed to provide an additional pattern of a phase transition layer on a substrate, whose pattern has a phase difference angle of 180° with respect to the phase of a light passing through a substrate having another, better light transmitting characteristic. The light transmitting rate of a phase transition layer can exist in various ranges. In addition, the phase shift masks of an alternating type and of a rim type (but not of an alternating type) have an appropriately arranged light transmitting region and phase transition layer at the boundary of the light shielding layer.

The alternating type phase shift mask has a light transmitting region and phase transition layer which are alternatingly arranged to the light shielding layer, and some patterns are additionally formed at the time of fabricating a device, so that the light intensity is increased. The rim type phase shift mask is directed to form a pattern of a phase transition layer, having relatively greater width than that of the pattern of the light shielding layer, on the pattern of the light shielding layer. The attenuating type phase shift mask is directed to use a light transmitting layer which does not include a light shielding layer and a layer of a phase transition having a relatively low light transmitting rate. Moreover, it is directed to use the entire regions, except the light transmitting region, as a phase transition layer.

The above described phase shift masks are difficult to use effectively because there are many problems in the fabrication and maintenance process of a reticle, such as pollution of a substrate caused during the fabrication of a semiconductor device, and in the design and test of the reticle. It is particularly difficult to use a rim type phase shift mask effectively.

As shown in FIG. 1, a conventional alternating type phase shift mask includes a spaced-apart pattern of a light shielding layer 2 of chrome formed on a light transmitting substrate 1, and a pattern of a phase transition layer 3 formed on the light transmitting substrate 1 of a region between patterns of the light shielding layer 2 and also on portions of each pattern of the light shielding layer 2.

A cross section of the above described construction taken along line IIa—IIa of FIG. 1 is shown in FIG. 2A. In addition, as shown in FIG. 2B, the edge portion of the pattern of the phase transition layer 3 comes into direct contact with the light transmitting substrate 1.

As shown in FIG. 3A, in the above described alternating type phase shift mask, the intensity of the light passing consecutively through both the light transmitting substrate 1 and the phase transition layer 3 is less than that of the light passing through only the light transmitting substrate 1. In addition, as the light passing consecutively through both the light transmitting substrate 1 and the phase transition layer 3 and the light passing through only the light transmitting substrate 1 come close to the edge portion of the pattern of the light shielding layer 2, the intensity of the light is decreased to a zero level.

As shown in FIG. 3B, the intensity of the light passing through the edge portion of the pattern of the phase transition layer 3 shown in FIG. 2B is about zero. The edge portion thereof plays a role of cutting the light. Meanwhile, at the edge portion of the phase transition layer 3, the amplitude of the light passing through both the light transmitting substrate 1 and the phase transition layer 3 sharply changes. The phase of this light is opposite to the phase of the light passing through the central portion of the phase transition layer 3.

Therefore, during photolithography, if the light passing through the edge portion of the phase transition layer 3 is exposed to the light on a positive photosensitive film (not shown) of the substrate (not shown), the light is subject to an undesired pattern in the region of the semiconductor substrate corresponding to the edge portion of the phase transition layer 3. Therefore, the above described phase shift mask has limitations in fabricating highly dense semiconductor devices.

As shown in FIG. 4, another conventional alternating type phase shift mask utilizes a spacer of a phase transition layer at the periphery of the pattern of the phase transition layer. This prevents an undesired phase transition of the light that passes through the edge portion of the phase transition layer. This type of conventional alternating type phase transition mask includes spaced-apart patterns of light shielding material 12 formed on the light transmitting substrate 11, a pattern of the phase transition layer 13 formed in the region between patterns of the light shielding layers 12 and also formed on a partial region of the patterns of the light shielding layer 12, and a spacer 16 formed at the periphery of the pattern of the phase transition layer 13.

A cross section of the above described construction is shown in FIG. 5A. In addition, as shown in FIG. 5B, the sidewall portions of the pattern of the phase transition layer 13 are formed of the spacer 16.

The spacer 16 of the phase transition layer 13 is formed on the light transmitting substrate 11 and the sidewalls of the phase transition layer 13 by a heat oxidization process and the phase transition layer 13 is etched by a dry etching process having an anisotropic etching characteristic. The pattern of the light shielding layer 12 can be affected by the high temperature occurring during the heat oxidizing process of the phase transition layer 13. Moreover, it is difficult to detect accurately completion of the etching process of the phase transition layer 13. Consequently, the surface of the light transmitting substrate 11 can easily be damaged.

As shown in FIG. 6, another conventional alternating type phase shift mask is characterized in that the phase transition layer has slanted sidewalls. This type of conventional alternating type phase shift mask includes spaced-apart patterns of a light shielding layer 22 of chrome formed on a light transmitting substrate 21, a pattern of a phase transition layer 23 formed on the light transmitting substrate 21 between and on patterns of the light shielding layers 22. The phase transition layer 23 has slightly slanted sidewalls.

The slanted sidewall of the phase transition layer 23 are difficult to form and require repeated series of exposure, developing and etching steps utilizing photo masks of decreasing areas and control over the depth of etching.

As described above, the conventional phase shift mask and the fabricating method thereof have disadvantages in that the surface of the light transmitting substrate can be easily damaged because it is difficult to verify a completion time of the etching process for forming the spacer of the phase transition layer. In addition, to make the sidewall of the phase transition layer slightly slanted, complicated photo-etching processes are needed so the entire processes become complicated. Moreover, the light shielding layer can be easily changed by the high temperature occuring during the heat process after the light shielding layer is formed. In the light exposing process, undesired patterns can be presented on the semiconductor substrate at a portion corresponding to the edge portion of the phase transition layer which comes into direct contact with the light transmitting substrate.

SUMMARY OF THE INVENTION

Accordingly, an object of the present invention is a phase shift mask and fabricating method thereof that substantially obviates problems due to limitations and disadvantages of the ralated art.

Another object of the present invention is a phase shift mask and a fabricating method thereof, which overcome the problems encountered in conventional phase shift masks and fabricating methods thereof.

A further object of the present invention is an improved phase shift mask, which advantageously includes a light transmitting region and a phase transition region that are made of the same material and integrally formed on a light transmitting substrate, a slanted boundary surface between a phase transition region and a light transmitting region, and a light shielding layer formed on the slanted boundary surface therebetween.

Additional objects and advantages of the invention will be set forth in the description which follows, and in part will be apparent from the description, or may be learned by practice of the invention. The objectives and other advantages of the invention will be realized and attained by the structure particulary pointed out in the written description and claims hereof as well as the appended drawings.

To achieve these and other advantages and in accordance with the purpose of the invention, asd embodied and broadly described, the phase shift mask of the present invention includes a light transmitting substrate; a light phase shift layer formed on the light transmitting substrate, the light phase shift layer including a light transmitting region of a first thickness and a phase transition region of a second thickness and a slanted region of a non-uniform thickness extending from the phase transition region; and a light shielding layer covering the slanted region.

The present invention further provides a phase shift mask fabricating method including the steps of froming a phase shift layer on a light transmitting substrate, the light phase shift layer including a light transmitting region of a first thickness and a phase transition region of a second thickness and a slanted region of a non-uniform thickness extending from the phase transition region; and forming a light shielding layer on the phase shift layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a better understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
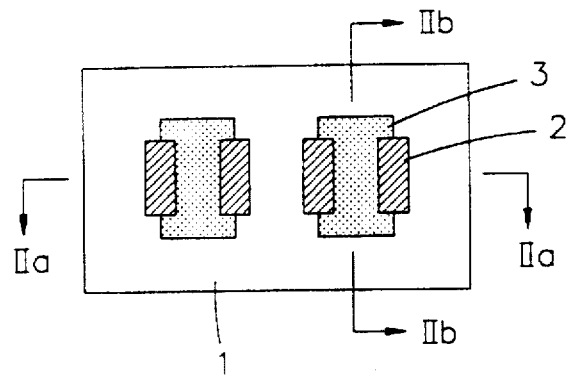
FIG. 1 is a top view of a conventional phase shift mask.
Figure 2A:
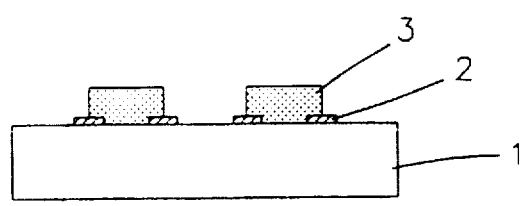
FIG. 2A a cross-sectional view taken along a line IIa—IIa of FIG. 1.
Figure 2B:
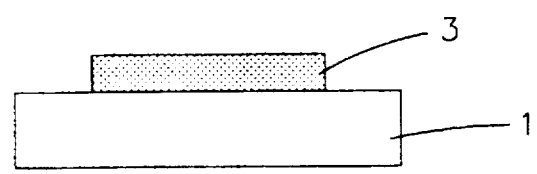
FIG. 2B is a cross-sectional view taken along line IIb—IIb of FIG. 1.
Figure 3A:
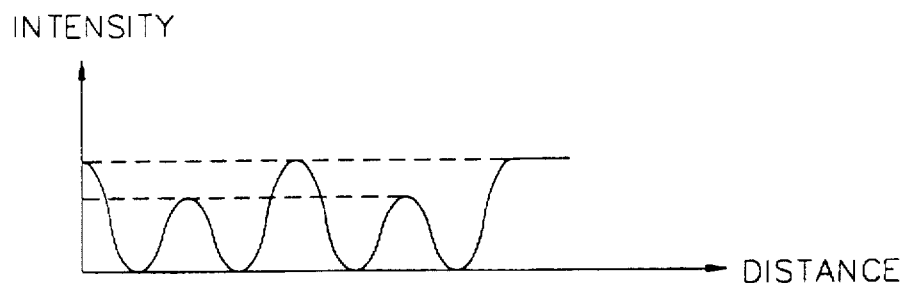
FIG. 3A is a graph of an intensity of a light passing through each region of FIG. 2A.
Figure 3B:
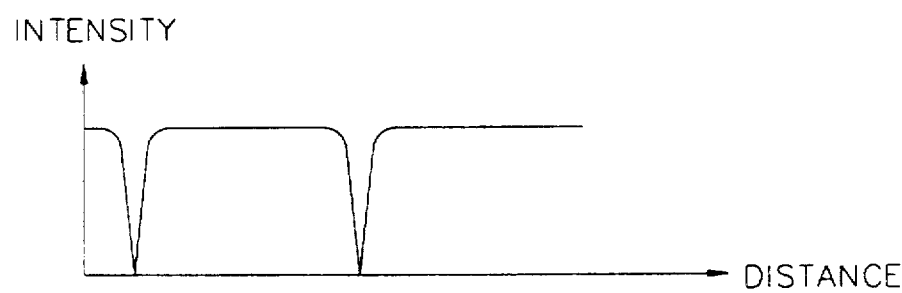
FIG. 3B is a graph of an intensity of a light passing through each region of FIG. 2B.
Figure 4:
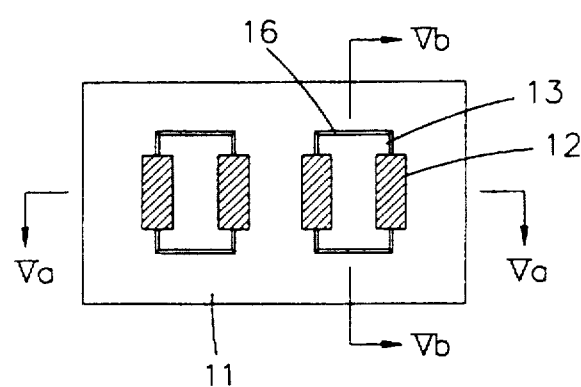
FIG. 4 is a top view of another conventional phase shift mask.
Figure 5A:
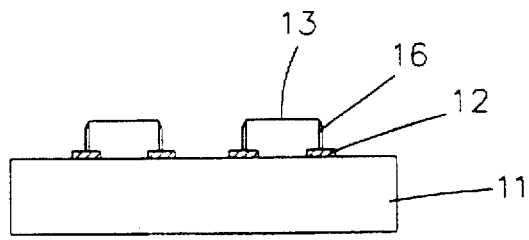
FIG. 5A is a cross-sectional view taken along a line Va—Va of FIG. 4.
Figure 5B:
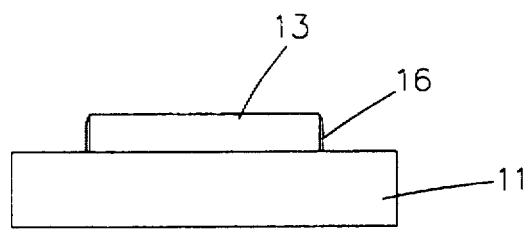
FIG. 5B is a cross-sectional view taken along a line Vb—Vb of FIG. 4.
Figure 6:
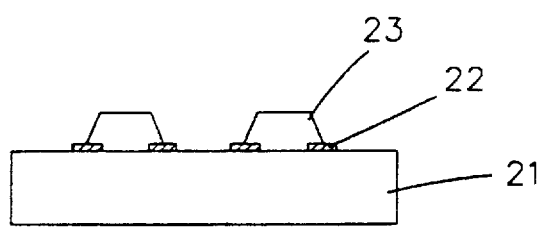
FIG. 6 is a cross-sectional view of another conventional phase shift mask.
Figure 7:
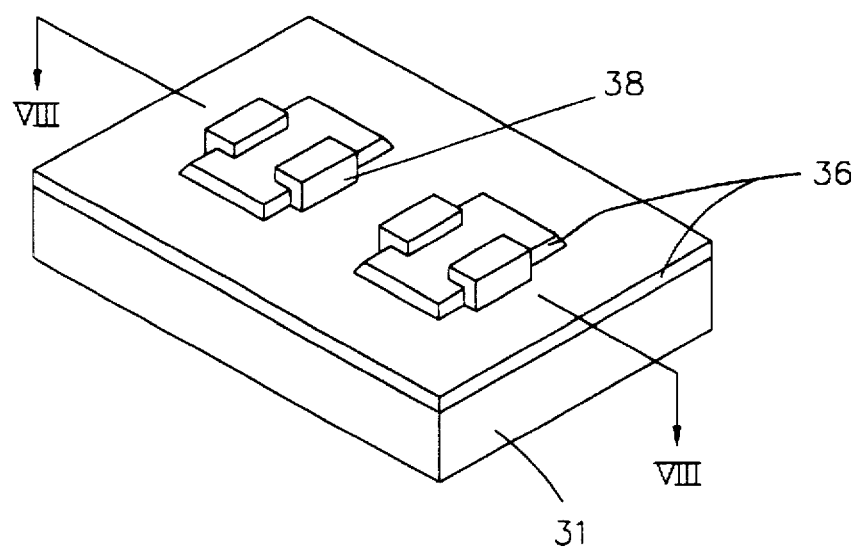
FIG. 7 is a perspective view of a phase shift mask according to a first embodiment of the present invention.
Figure 8:
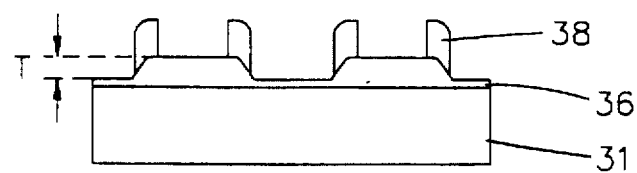
FIG. 8 is a cross-sectional view taken along VIII—VIII of FIG. 7.

As shown in FIG. 7, a phase shift mask according to a first embodiment of the present invention includes a substrate 31, a layer 36 comprising a light transmitting region 36a and a phase transition region 36b which are made of the same material, and a light shielding layer 38 formed on a slightly slanted region of the layer 36 at the phase transition region 36b. With reference to FIG. 8, the layer 36 is a heat oxidized layer and has a thickness in the light transmitting layer 36a smaller than that in the phase transition region 36b by a thickness T.

The fabricating method of the phase shift mask according to a first embodiment of the present invention is as follows.

Figure 9A:
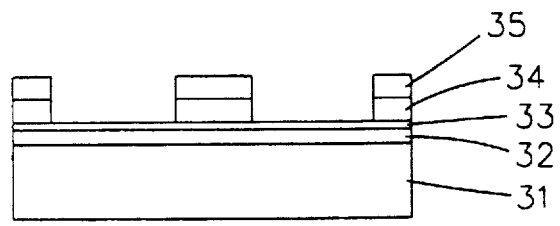
FIGS. 9A through 9C are views of the steps of a fabricating process of a phase shift mask according to the present invention.

Initially, as shown in FIG. 9A, an oxide film 32, amorphous silicon layer 33, and a nitride film 34 are formed in order on a substrate of a light transmitting quartz. Thereafter, a pattern of a photosensitive film 35 is formed on the desired region of the nitride film 34, and a desired pattern of the nitride film 34 is formed by etching the nitride film 34 of the unmasked region.

Figure 9B:
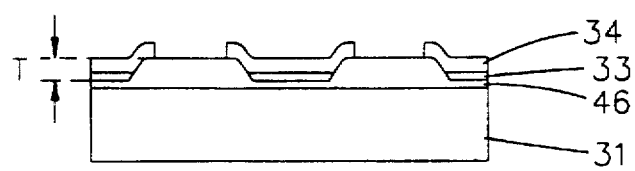

As shown in FIG. 9B, after removal of the photosensitive film 35, the layer 36 is integrally formed with the oxide film 32 by heat-oxidizing the amorphous silicon layer 33 of the unmasked region. At this time, the region of the layer 36 unmasked by the nitride film 34 becomes a phase transition region 36b, and the region masked by the nitride film 34 becomes a light transmitting region 36a. The difference T between the thickness of the phase transition region 36b of the layer 36 and the light transmitting region 36a of the layer 36 can cause a substantial phase shift. This is particularly true because the surface of the region between the phase transition region 36b and the light transmitting region 36a of the layer becomes slanted. Meanwhile, the portions of the amorphous silicon layer 33 under the pattern of the nitride film 34 remain unoxidized.

Figure 9C:
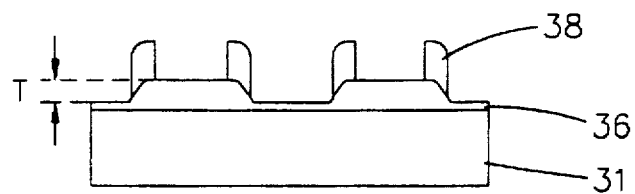

As shown in FIG. 9C, the pattern of the nitride film 34 and the remaining amorphous silicon layer 33 are removed.

Thereafter, after depositing a light shielding layer 38 on the layer 36, a pattern of the light shielding layer 38 is formed on the region between the light transmitting region 36a and the phase transition region 36b of the layer 36 using a conventional photo-etching method to achieve the construction as shown in FIGS. 7 and 8.

Figure 10:
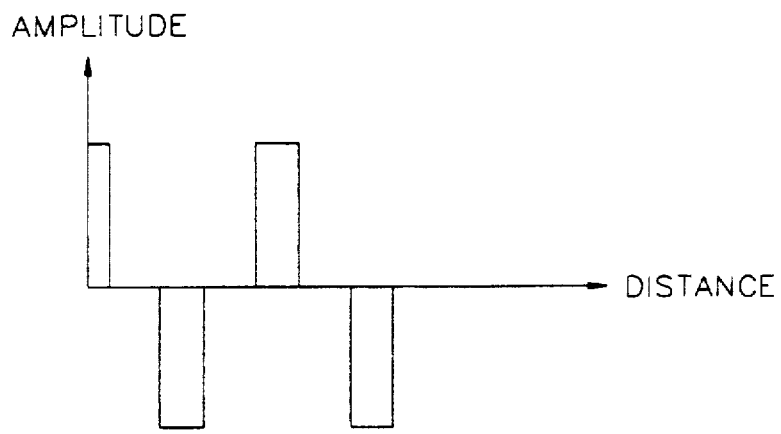
FIG. 10 is a graph of a vibrational amplitude of a light passing through each region of FIG. 8.
Figure 11A:
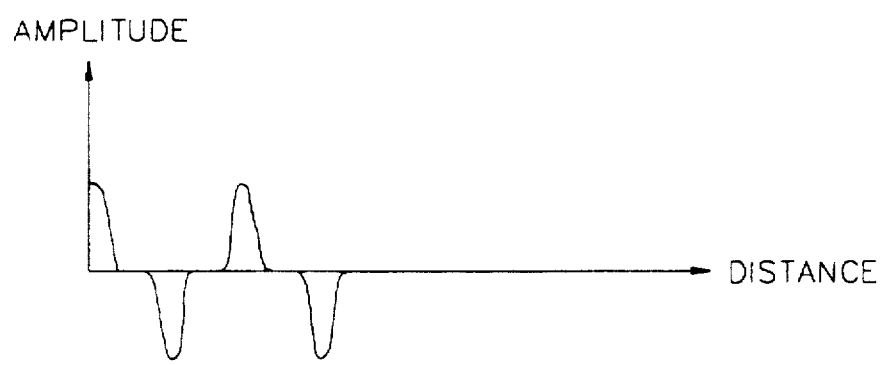
FIGS. 11A and 11B are graphs of vibrational amplitudes and intensities of a light exposed to a photosensitive film formed of a substrate and passing through each region of FIG. 8.
Figure 11B:
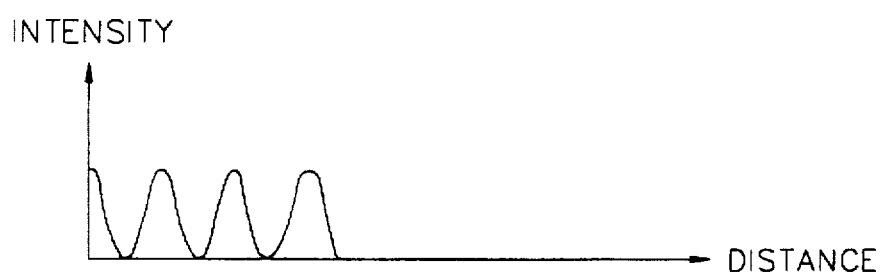

The operation of the phase shift mask according to a first embodiment of the present invention is as follows. It is illustrated in FIGS. 10, 11A and 11B.

In the photolithography method, the light passing through each region of the phase shift mask has a different phase for each region. That is, as shown in FIG. 10, the light passing consecutively through the phase transition region 36b of the layer 36 and the substrate 31 has a constant negative amplitude value. By comparison, the light passing consecutively through the light transmitting region 36a of the layer 36 and the substrate 31 has the same absolute value as the above described light but has a constant positive amplitude value. As shown in FIG. 11A, the light transferred to a semiconductor substrate (not shown) and a photosensitive film (not shown), through the phase transition region 36b has a negative amplitude value. This negative amplitude value approaches zero near the light shielding layer 38. By comparison, light passing through the light transmitting regions 36a has a positive amplitude value. This positive amplitude value approaches zero near the light shielding layer 38. As shown in FIG. 11B, light passing through the phase transition region 36b has the same absolute amplitude value as light passing through the light transmitting region 36a. Further, the absolute amplitude value approaches zero near the light shielding layer 38.

A phase shift mask according to the second embodiment of the present invention is as follows.

Figure 13:
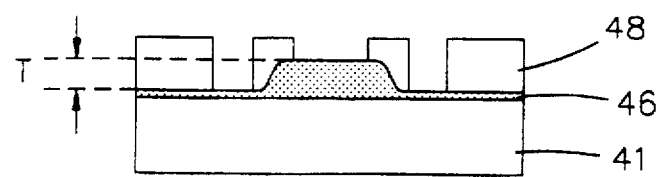
FIG. 13 is a cross-sectional view taken along a line XIII—XIII of FIG. 12.

Initially, the phase shift mask includes a substrate 41, a layer 46 formed on the substrate 41, and a light shielding layer 48 having a main opening for a contact hole formed on the layer 46 and a sub-main opening spaced apart by a predetermined distance from each sidewall of the main opening. The layer 46 is a heat oxide layer As shown in FIG. 13, the thickness of the light transmitting region 46a of the layer 46 in which the main opening is formed is greater than that of the phase transition region 46b of the layer 46 in which the sub-main opening is formed by a thickness T. The width of the sub-main opening is smaller than that of the main opening.

The main opening for a contact hole is formed on the light transmitting region 46a of the layer 46 by the light shielding layer 48 on slightly slanted region between the light transmitting region 46a and the phase transition region 46b of the layer 46. The sub-main openings are formed on the phase transition regions 46b by the light shielding layer 48 between the slightly slanted region separating the light transmitting region 46a and the phase transition region 46b of the layer.

A fabricating method of the phase shift mask according to the second embodiment of the present invention is as follows.

Figure 14A:
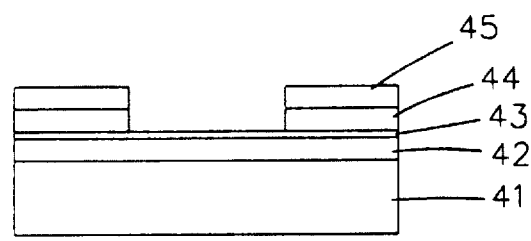
FIGS. 14A through 14C are views of the steps of a fabricating process of the phase shift mask of FIG. 12.

Initially, as shown in FIG. 14A, an oxide film 42, an amorphous silicon layer 43, and a nitride film 44 are consecutively formed on a substrate of a light transmitting quartz. Thereafter, a pattern of a photosensitive film 45 is formed on a desired region of the nitride film 44, and a desired pattern of a nitride film 44 is formed on the regions unmasked by the pattern of the photosensitive film 45 by etching the nitride film 44.

Figure 14B:
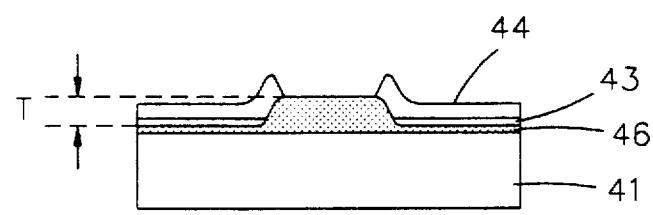

As shown in FIG. 14B, after removing the photosensitive film 45, a layer 46 is formed by heat-oxidizing the amorphous silicon layer 43 in the regions unmasked by the nitride film 44, and the oxide film 42. The region of the layer 46 unmasked by the nitride film 44 becomes a light transmitting region 46a. The portions of the layer 46 masked by the nitride film 44 form phase transition region 46b. The thickness of the light transmitting region 46a of the layer 46 is greater than that of the phase transition region 46b of the layer 46 by an amount T which provides a phase shift. The layer 46 between the light transmitting region 46a and the phase transition region 46b is slightly slanted. The amorphous silicon layer 43 under the nitride film 44 remains unoxidized.

Figure 12:
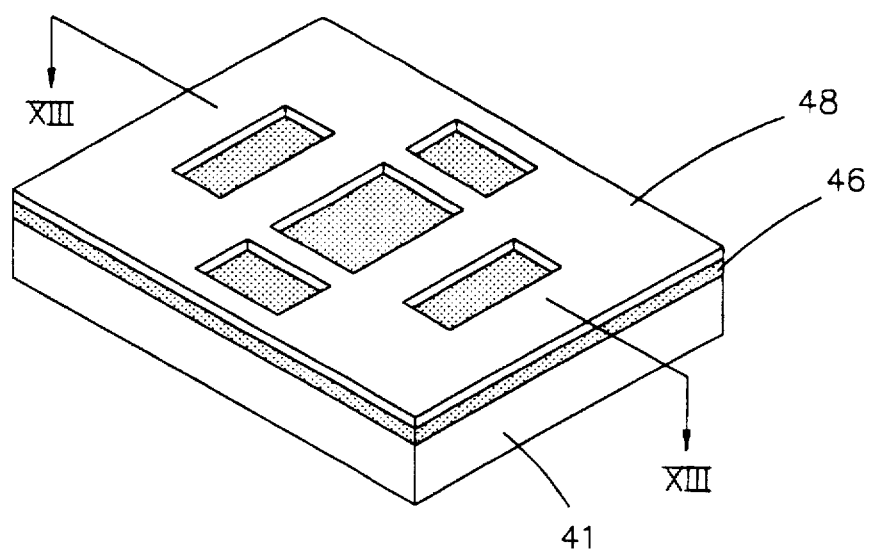
FIG. 12 is a perspective view of a phase shift mask according to a second embodiment of the present invention.
Figure 14C:
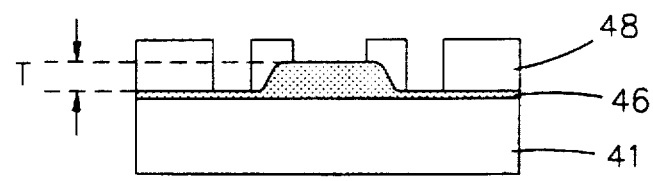

As shown in FIG. 14C, the remaining nitride film 44 and the amorphous silicon layer 43 are removed. Thereafter, as shown in FIGS. 12 and 13, the light shielding layer 48 is deposited on the layer 46 and the main opening and a sub-main openings of the light shielding layer 48 are formed on the layer 46. Thus, a phase shift mask as shown in FIGS. 12 and 13 is fabricated.

Figure 15:
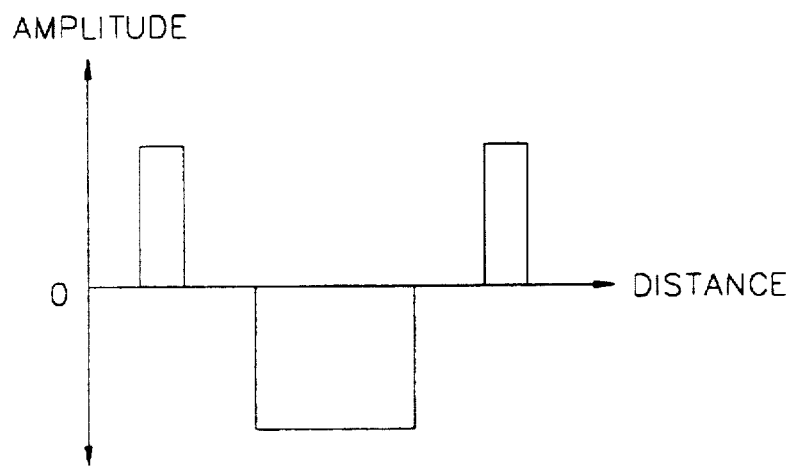
FIG. 15 is a graph of a vibrational amplitude of a light passing throught each region of FIG. 12.
Figure 16A:
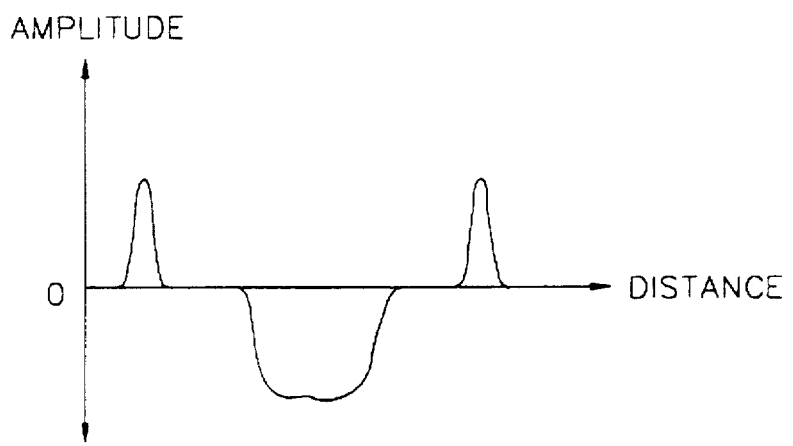
FIGS. 16A and 16B are graphs of vibrational amplitudes and intensities of a light exposed to a photosensitive film formed of a substrate and passing through each region of FIG. 12.
Figure 16B:
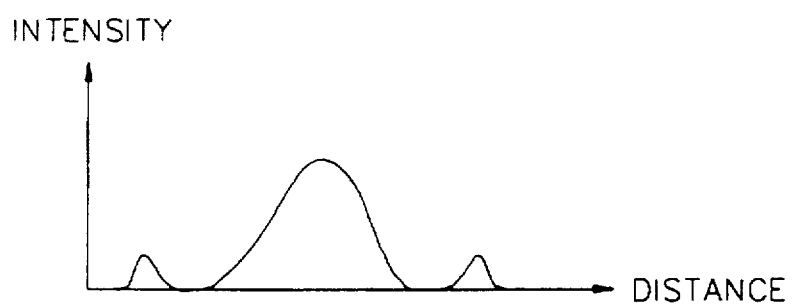

An operation of the phase shift mask according to a second embodiment of the present invention is as follows and is illustrated in FIGS. 15, 16A and 16B.

In the photolithography method, light passing through each region of the phase shift mask will have different phases. That is, as shown in FIG. 15, the light passing consecutively through the phase transition region 46b and the substrate 41 through the sub-main openings has a positive amplitude value. By comparison, the light passing consecutively through the light transmitting region 46a and the substrate 41 through the main opening has a negative amplitude value but the same absolute level. Light that exposes the photosensitive film (not shown) of the semiconductor substrate, as shown in FIG. 16A, after passing through the phase transition region 46b has a positive amplitude value. This positive amplitude value approaches zero near the light shielding layer 48. By comparison, light that passes through the light transmitting region 46a has a negative amplitude value. This negative amplitude value approaches zero near the light shielding layer 48.

As shown in FIG. 16B, the light that passes through the light transmitting region 46a has a relatively high positive intensity, but the intensity approaches zero near the edge portions of the light shielding layer 48. By comparison, the light passing through the phase transition region 46b has a relatively low positive intensity, which approaches zero near the light shielding layer 48. Therefore, the light passing through the light transmitting region 46a of the layer 46 through the main opening will form a pattern of the main opening on the photosensitive film. By comparison, the light passing through the phase transition region 46b of the layer 46 does not form a pattern on the photosensitive film and has higher intensity in the region of the photosensitive film in which a pattern is formed.

A phase shift mask according to a third embodiment of the present invention is as follows.

Figure 17:
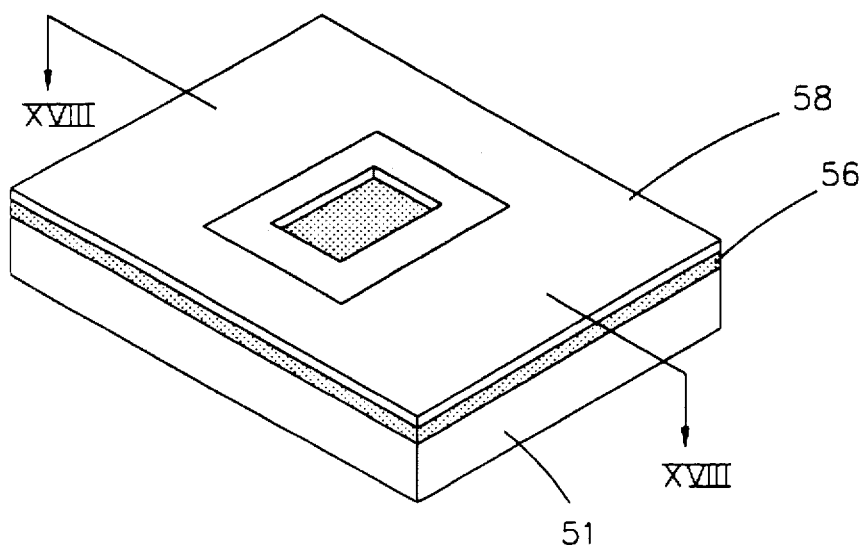
FIG. 17 is a perspective view of a phase shift mask according to a third embodiment of the present invention.

As shown in FIG. 17, a phase shift mask includes a substrate 51, a layer 56 having a groove formed for a contact hole on a region and formed on the substrate 51, and a light shielding layer 58 formed on the region outside of the central portion of the layer 56. The layer 56 is a heat-oxided layer. The thickness of the central portion of the layer 56 is greater than that of the remaining portion thereof, so the surface of the region except the central portion of the layer 56 is slightly slanted. The thickness of the phase transition region 56b of the central portion of the layer 56 is greater by an amount than that of the light transmitting region 56a. In the central portion of the layer 56, a groove of depth T is formed. The light shielding layer 58 is formed around the central portion of the slanted region of the layer 56 such that the light shielding layer 58 and the central portion of the layer 56 together form a flat surface.

A fabricating method of the phase shift mask according to the third embodiment of the present invention is as follows.

Figure 19A:
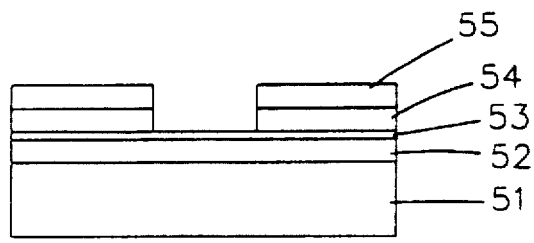
FIGS. 19A through 19D shows the steps of the fabricating process for the phase shift mask according to the third embodiment of the present invention.

As shown in FIG. 19A, an oxide film 52, an amorphous silicon layer 53, and a nitride film 54 are consecutively formed on a substrate 51 of a light transmitting quartz. Thereafter, a pattern of the photosensitive film 55 is formed on the desired region of the nitride film, and a desired pattern of the nitride film 54 is formed by etching the nitride film 54 in the regions unmasked by the photosensitive film 55.

Figure 19B:
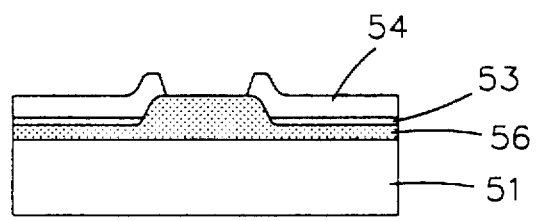

As shown in FIG. 19B, after removing the photosensitive film 55, a layer 56 is formed, by heat-oxidizing the amorphous silicon layer 53 in the region that had not been masked by the pattern of the nitride film 54 and the oxide film 52. At this time, the region unmasked by the nitride film 54 becomes a phase transition region 56b, and a region in which a groove is formed on the phase transition region 56b becomes a light transmitting region 56a. The thickness of the phase transition region 56b of the layer 56 is greater than the thickness of the region 56a masked by the nitride film 54 of layer 52 and the surface therebetween is slightly slanted. Meanwhile, the amorphous silicon layer 53 remains unoxidized under the pattern of the nitride film 54.

Figure 19C:
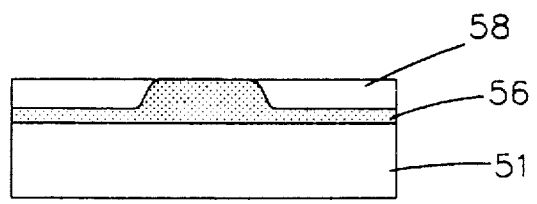

As shown in FIG. 19C, the pattern of the nitride film 54 and the remaining amorphous silicon layer 53 are removed. Thereafter, after depositing the light shielding layer 58 on the layer 56, the light shielding layer 58 is etched by a chemical grinding method or a dry etching method having an anisotropic etching characteristic and is formed on the region between the region outside of the phase transition region 56b of the layer 56 and the slightly slanted region of the phase transition region, such that the surface between the light shielding layer 58 and the phase transition region of the layer 56 is substantially flat.

Figure 18:
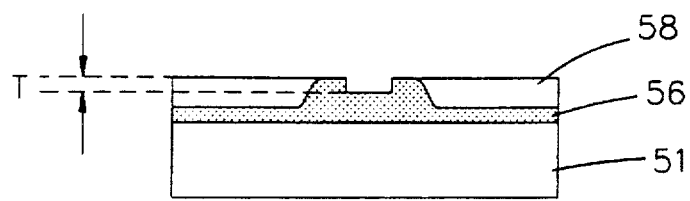
FIG. 18 is a cross-sectional view taken along XVIII—XVIII of FIG. 17.
Figure 19D:
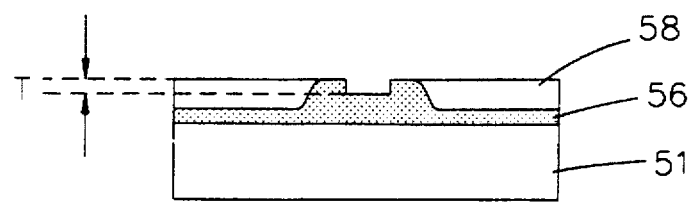

As shown in FIG. 19D, a groove having a depth T capable of causing a phase transition to the light transmitting region of the layer 56 is formed using a conventional photo-etching method. Thus, a phase shift mask having a construction as shown in FIGS. 17 and 18 is achieved.

Figure 20:
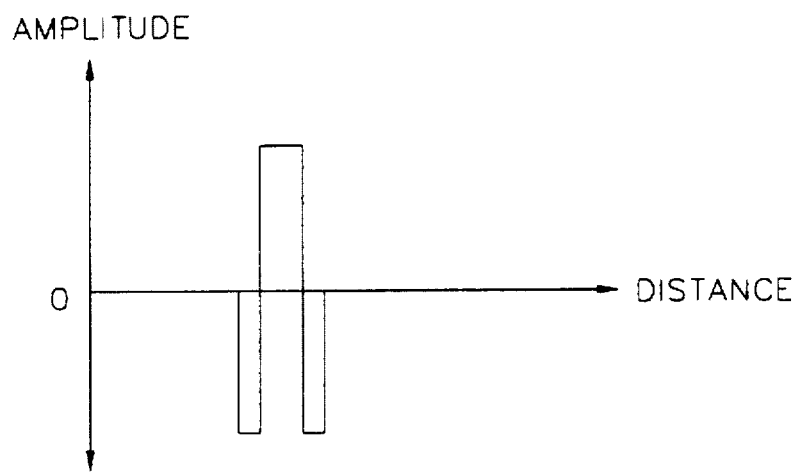
FIG. 20 is a graph of a vibrational amplitude of a light passing through each region of FIG. 17.
Figure 21A:
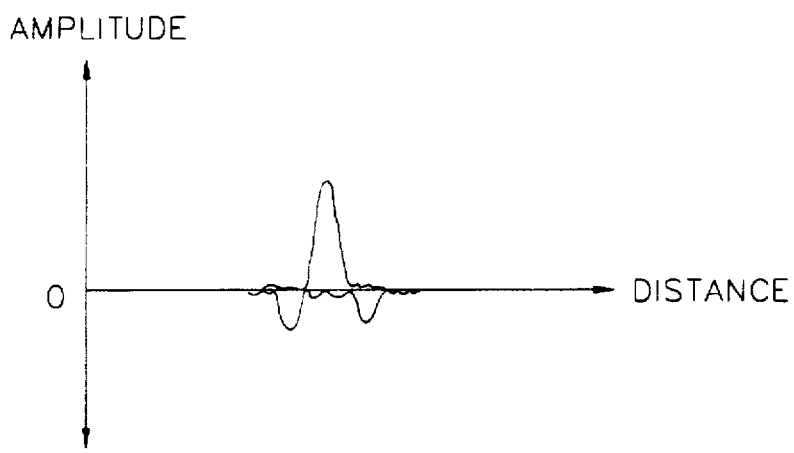
FIGS. 21A and 21B are graphs of vibrational amplitudes and intensities of a light exposed to a photosensitive film formed of a substrate and passing through each region of FIG. 17.

The operation of the phase shift mask according to the third embodiment of the present invention is as follows. It is illustrated in FIGS. 20, 21A and 21B.

Initially, in the photolithography method, the exposed light passing through each region of the phase shift mask has different phases from one another. That is, as shown in FIG. 20, the light passing consecutively through the phase transition region 56b and the substrate 51 has a negative amplitude value. By comparison, the light passing consecutively through the light transmitting region 56a and the substrate 51 through the groove has the same amplitude value as the above described light except it has a positive amplitude. However, in case that it is exposed to the photosensitive film (not shown) on a semiconductor substrate (not shown), as shown in FIG. 21A, the light passing through the phase transition region 56b has a negative amplitude value, and near the edge of the light shielding layer 58 and the light transmitting region 56a, the negative amplitude value approaches zero. By comparison, the light passing through the light transmitting region 56a has a positive amplitude value. Near the phase transition region 56b, the positive amplitude value approaches zero.

Figure 21B:
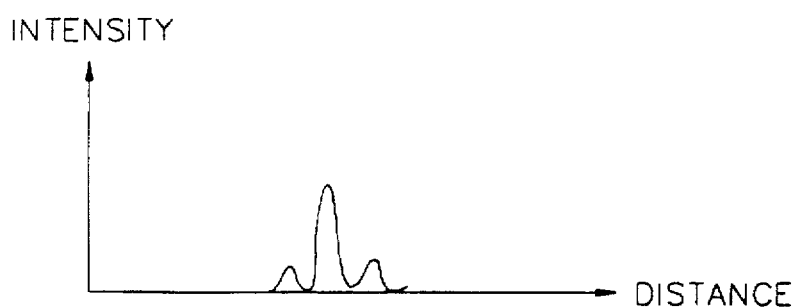

As shown in FIG. 21B, the intensity of the light passing through the light transmitting region 56a has a relatively high positive intensity greater than that of the light passing through the phase transition region 56b, and near the edge portion of the phase transition region 56b, the value approaches zero. Meanwhile, the intensity of the light passig through the phase transition region 56b approaches zero near the edge of the light transmitting region 56a. Therefore, the light passing through the light transmitting region 56a can cause a pattern to be formed on the photosensitive film for a contact hole. By comparison, the light passing through the phase transition region 56b does not cause a pattern on the photosensitive film to be formed and increases the intensity of the light of the region of the photosensitive film in which a pattern is formed for the contact hole.

As described above, the phase shift mask of the present invention is directed to reduce a difference in the light transmitting rate of a phase transition region and a light transmitting region by integrally forming the phase transition region and the light transmitting region with the same material on the substrate of the phase shift mask. The present invention also prevents surface damage of a substrate by forming a phase transition region and a pattern of the light shielding layer by etching the light shielding layer without exposing the surface of the substrate, and to prevent the variation of the phase transition layer by forming the light shielding layer on the phase transition layer after forming a phase transition layer, and to easily forming a more flat and a precise pattern by forming a phase transition layer using a heat oxidizing method.

It will be apparent to those skilled in the art that various modifications and variations can be made in the phase shift mask and fabricating method thereof of the present invention without departing from the spirit or scope of the invention. Thus, it is intended that the present invention cover the modifications and variations of this invention provided they come within the scope of the appended claims and their equivalents.

What is claimed is:

1. A phase shift mask, comprising:

a light transmitting substrate;

a light phase shift layer formed on the light transmitting substrate, the light phase shift layer including a light transmitting region of a first thickness and a phase transition region of a second thickness and a slanted region of a non-uniform thickness extending from the phase transition region; and a light shielding layer formed above the slanted region.

2. The phase shift mask as claimed in claim 1, wherein the light shielding layer covers only the slanted region.

3. The phase shift mask as claimed in claim 1, wherein the light shielding layer includes a main opening formed on the light transmitting region and a sub-main opening formed on the phase transition region, with a width of the main opening being greater than a width of the sub-main opening.

4. The phase shift mask as claimed in claim 1, wherein the light transmitting region includes a groove surrounded by the phase transition region.

5. The phase shift mask as claimed in claim 1, wherein the first thickness is less than the second thickness.

6. The phase shift mask as claimed in claim 1, wherein the first thickness is greater than the second thickness.

7. The phase shift mask as claimed in claim 1, wherein a difference between the first thickness and the second thickness affects a phase shift of light passing therethrough.

8. The phase shift mask as claimed in claim 1, wherein the light transmitting region and the phase transition region are made of a same material.

9. The phase shift mask as claimed in claim 1, wherein the light transmitting region and the phase transition region each include an oxide film.

10. The phase shift mask as claimed in claim 1, wherein the light transmitting region and the phase transition region are integrally formed.

11. The phase shift mask as claimed in claim 1, wherein a region of the light phase shift layer affects an intensity of light exposed to a photosensitive film through another region of the light phase shift layer.

12. The phase shift mask as claimed in claim 1, wherein a surface of the light shielding layer is substantially flat.

13. The phase shift mask as claimed in claim 1, wherein a surface of the phase transition region is substantially flat.

14. A phase shift mask fabricating method, comprising the steps of:

forming a light phase shift layer on a light transmitting substrate, the light phase shift layer including a light transmitting region of a first thickness and a phase transition region of a second thickness and a slanted region of a non-uniform thickness extending from the phase transition region; and thereafter forming a light shielding layer above the slanted region.

15. The method as claimed in claim 14, wherein the step of forming the light phase shift layer includes the steps of:

forming an oxide film layer on the light transmitting substrate;

forming a silicon layer on the oxide film layer;

forming an anti-oxidizing layer on a first portion of the silicon layer;

oxidizing a second portion of the silicon layer which is not masked by the anti-oxidizing layer;

removing the anti-oxidizing layer; and removing the first portion of the silicon layer which is not oxidized.

16. The method as claimed in claim 15, wherein the anti-oxidizing layer includes a nitride film.

17. The method as claimed in claim 15, wherein the silicon layer includes an amorphous silicon material.

18. The method as claimed in claim 14, wherein the step of forming the light shielding layer includes the steps of:

depositing the light shielding layer on the light phase shift layer; and patterning the light shielding layer so that the light shielding layer remains only on the slanted region of the light phase shift layer.

19. The method as claimed in claim 14, wherein the step of forming the light shielding layer includes the steps of:

depositing the light shielding layer on the light phase shift layer; and patterning the light shielding layer to form a main opening on the light transmitting region and a sub-main opening on the phase transition region, wherein a width of the main is greater than a width of the sub-main opening.

20. The method as claimed in claim 14, wherein the steps of forming the light phase shift layer includes forming a groove to be used as the light transmitting region, the groove being surrounded by the phase transition region, and the step of forming the light shielding layer includes the steps of:

depositing the light shielding layer on the phase transition region and the slanted region; and etching the light shielding layer so that a surface between the light shielding layer and the phase transition region is substantially flat.

21. The method as claimed in claim 20, wherein the light shielding layer is etched by a mechanical-chemical grinding method.

22. The method as claimed in claim 20, wherein the light shielding layer is etched by an anisotropic dry etching method.

23. The method as claimed in claim 14, wherein the first thickness is less than the second thickness.

24. The method as claimed in claim 14, wherein the first thickness is greater than the second thickness.

25. The method as claimed in claim 14, wherein the light transmitting region and the phase transition region are made of a same material.

26. The method as claimed in claim 14, wherein the light transmitting region and the phase transition region each include an oxide film.

27. The method as claimed in claim 14, wherein the light transmitting region and the phase transition region are integrally formed.

28. A phase shift mask fabricating method comprising the steps of:

forming an oxide film layer on a light transmitting substrate;

forming a silicon layer on the oxide film layer;

forming a nitride film layer on a first portion of the silicon layer;

oxidizing a second portion of the silicon layer which is not covered by the nitride film layer;

removing the nitride film layer and the first portion of the silicon layer which is not oxidized; and selectively forming a light shielding layer above the second portion of the silicon layer and the oxide film layer.

29. The method as claimed in claim 28, wherein the second portion of the silicon layer becomes a phase transition region and the oxide film layer under the removed first portion of the silicon layer becomes a light transmitting region, there is a slanted region of a non-uniform thickness between the phase transition region and the light transmitting region, and the light shielding layer is formed above the slanted region.

* * * * *